(12) United States Patent
Su

(10) Patent No.: US 12,112,825 B2
(45) Date of Patent: Oct. 8, 2024

(54) SENSE AMPLIFIER, MEMORY, AND CONTROL METHOD

(71) Applicant: CHANGXIN MEMORY TECHNOLOGIES, INC., Hefei (CN)

(72) Inventor: Hsin-Cheng Su, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/655,323

(22) PCT Filed: Jul. 21, 2021

(86) PCT No.: PCT/CN2021/107522
§ 371 (c)(1),
(2) Date: Mar. 17, 2022

(87) PCT Pub. No.: WO2022/198856
PCT Pub. Date: Sep. 29, 2022

(65) Prior Publication Data
US 2024/0005967 A1 Jan. 4, 2024

(30) Foreign Application Priority Data
Mar. 24, 2021 (CN) .......................... 202110313695.9

(51) Int. Cl.
G11C 11/4091 (2006.01)
G11C 7/08 (2006.01)

(52) U.S. Cl.
CPC ............ *G11C 7/08* (2013.01); *G11C 11/4091* (2013.01)

(58) Field of Classification Search
CPC ............................. G11C 7/08; G11C 11/4091
See application file for complete search history.

(56) References Cited

U.S. PATENT DOCUMENTS 5,526,313 A 6/1996 Etoh et al.
5,659,260 A 8/1997 Kajimoto et al.
(Continued)

FOREIGN PATENT DOCUMENTS

CN 1496568 A 5/2004
CN 101140798 A 3/2008
(Continued)

OTHER PUBLICATIONS

European Search Report cited in 21904625.7 mailed Jul. 7, 2023, 11 pages.
(Continued)

*Primary Examiner* — Min Huang
(74) *Attorney, Agent, or Firm* — Syncoda LLC; Feng Ma

(57) ABSTRACT

The present application provides a sense amplifier, a memory, and a control method. The sense amplifier includes: an amplification module, configured to amplify a voltage difference between a bit line and a reference bit line when the sense amplifier is at an amplification stage; and a controlled power module, connected to the amplification module, and configured to: determine a drive parameter according to a rated compensation voltage range between the bit line and the reference bit line, and supply power to the amplification module according to the drive parameter, so as to control the amplification module to pull a compensation voltage between the bit line and the reference bit line to be a rated compensation voltage at an offset cancellation stage, where the rated compensation voltage is within the rated compensation voltage range.

15 Claims, 6 Drawing Sheets

(56) References Cited

U.S. PATENT DOCUMENTS

| | | | |
|---|---|---|---|
| 6,147,916 | A | 11/2000 | Ogura |
| 6,819,600 | B2 | 11/2004 | Sim |
| 6,847,568 | B2 | 1/2005 | Gogl et al. |
| 7,394,714 | B2 | 7/2008 | Lin et al. |
| 7,663,953 | B2 | 2/2010 | Cheng et al. |
| 8,817,528 | B2 | 8/2014 | Otto et al. |
| 9,390,793 | B1 | 7/2016 | Nigam et al. |
| 9,449,680 | B2 | 9/2016 | Huang |
| 10,388,355 | B1 | 8/2019 | Ware et al. |
| 11,024,365 | B1 * | 6/2021 | Seo ............... G11C 11/4091 |
| 2003/0021171 | A1 | 1/2003 | Beigel et al. |
| 2007/0076501 | A1 | 4/2007 | Kang et al. |
| 2008/0225617 | A1 | 9/2008 | Cheng et al. |
| 2011/0205812 | A1 | 8/2011 | Kajigaya |
| 2011/0235402 | A1 * | 9/2011 | Ueda ............... G11C 11/1657 |
| | | | 365/158 |
| 2011/0255359 | A1 * | 10/2011 | Sachdev ............ G11C 7/062 |
| | | | 365/207 |
| 2012/0081986 | A1 | 4/2012 | Joo et al. |
| 2016/0012868 | A1 * | 1/2016 | Moon ............... G11C 7/065 |
| | | | 365/189.11 |
| 2017/0018295 | A1 * | 1/2017 | Kim ............... G11C 7/065 |
| 2017/0133084 | A1 | 5/2017 | Hwang |
| 2019/0362760 | A1 * | 11/2019 | Lin ............... G11C 29/028 |
| 2020/0075082 | A1 * | 3/2020 | Derner ............ G11C 11/4091 |
| 2021/0005243 | A1 | 1/2021 | Bae |
| 2021/0366523 | A1 | 11/2021 | Wang |

FOREIGN PATENT DOCUMENTS

| | | |
|---|---|---|
| CN | 102394094 A | 3/2012 |
| CN | 101562042 B | 6/2012 |
| CN | 102881318 A | 1/2013 |
| CN | 103021455 A | 4/2013 |
| CN | 103123808 A | 5/2013 |
| CN | 103594111 A | 2/2014 |
| CN | 105976859 A | 9/2016 |
| CN | 106205676 A | 12/2016 |
| CN | 109712651 A | 5/2019 |
| CN | 111739565 A | 10/2020 |
| CN | 111863049 A | 10/2020 |
| CN | 111863052 A | 10/2020 |
| CN | 111863053 A | 10/2020 |
| CN | 111863055 A | 10/2020 |
| CN | 112447208 A | 3/2021 |
| CN | 112992200 A | 6/2021 |
| CN | 112992201 A | 6/2021 |
| CN | 112992202 A | 6/2021 |
| CN | 112992203 A | 6/2021 |
| CN | 113012729 A | 6/2021 |
| JP | S58102389 A | 6/1983 |
| JP | 2002025268 A | 1/2002 |
| KR | 20040003210 A | 1/2004 |
| KR | 20070084781 A | 8/2007 |
| TW | M358390 U | 6/2009 |
| WO | 2021036104 A1 | 3/2021 |

OTHER PUBLICATIONS

Notice for Reason of Rejection cited in JP2022-544414, mailed Jun. 13, 2023, 11 pages.
International Search Report cited in PCT/CN2021/107522, mailed Nov. 17, 2021, 9 pages.
International Search Report cited in PCT/CN2021/107523, mailed Dec. 8, 2021, 10 pages.
First Office Action cited in 202110314347.3, mailed Feb. 22, 2022, 17 pages.
International Search Report cited in PCT/CN2021/107681, mailed Nov. 30, 2021, 10 pages.
International Search Report cited in PCT/CN2021/107679, mailed Dec. 16, 2021, 10 pages.
International Search Report cited in PCT/CN2021/107888, mailed Dec. 23, 2021, 10 pages.
KR office action in application No. 10-2022-7022183, mailed on May 30, 2024.

* cited by examiner

SENSE AMPLIFIER, MEMORY, AND CONTROL METHOD

The present application claims the priority to Chinese Patent Application No. 202110313695.9, titled "SENSE AMPLIFIER, MEMORY, AND CONTROL METHOD", filed to China National Intellectual Property Administration, on Mar. 24, 2021, which is incorporated herein by reference in its entirety.

TECHNICAL FIELD

The present application relates to, but is not limited to, a sense amplifier, a memory, and a control method.

BACKGROUND

With the popularity of electronic devices such as cell phones, tablets, and personal computers, semiconductor memory technologies are also developing rapidly.

A sense amplifier (SA) is an important composition part of a semiconductor memory, which mainly functions to amplify a small signal on a bit line, to further perform a read or write operation. As a line width of the semiconductor memory shrinks, a capacitance of a memory cell in the semiconductor memory decreases, and a noise of a circuit in the semiconductor memory seriously affects sensing resolution of the sense amplifier. Therefore, an offset cancellation sense amplifier (OCSA) is used in the semiconductor memory.

However, after the OSCA is introduced, an external read circuit is prone to incorrectly reading data presented on a bit line and a reference bit line.

SUMMARY

An embodiment of the present application provides a sense amplifier, including:
an amplification module, configured to amplify a voltage difference between a bit line and a reference bit line when the sense amplifier is at an amplification stage; and
a controlled power module, connected to the amplification module, and configured to: determine a drive parameter according to a rated compensation voltage range between the bit line and the reference bit line, and supply power to the amplification module according to the drive parameter, so as to control the amplification module to pull a compensation voltage between the bit line and the reference bit line to be a rated compensation voltage at an offset cancellation stage; where the rated compensation voltage is within the rated compensation voltage range.

An embodiment of the present application further provides a memory, including the sense amplifier in the foregoing embodiment of the present application and a memory cell, where
a plurality of memory cells constitute a first storage array, a plurality of memory cells constitute a second storage array, the sense amplifier is located between the first storage array and the second storage array, a third terminal of the sense amplifier is connected to a bit line of the first storage array, and a fourth terminal of the sense amplifier is connected to a reference bit line of the second storage array.

An embodiment of the present application further provides a control method of a sense amplifier. The sense amplifier includes an amplification module and a controlled power module. The control method of a sense amplifier includes:
obtaining a rated compensation voltage range between a bit line and a reference bit line;
determining a drive parameter according to the rated compensation voltage range; and
generating, according to the drive parameter, a control signal used to control the amplification module, so as to control the amplification module to pull a compensation voltage between the bit line and the reference bit line to be a rated compensation voltage at an offset cancellation stage; where the rated compensation voltage is within the rated compensation voltage range.

DETAILED DESCRIPTION

In order to make the objectives, technical solutions and advantages of the present application clearer, the following clearly and completely describes the technical solutions in the present application with reference to the accompanying drawings in the present application. Apparently, the described embodiments are some rather than all of the embodiments of the present application. All other embodiments obtained by those of ordinary skill in the art based on the embodiments of the present application without creative efforts should fall within the protection scope of the present application.

Figure 1:
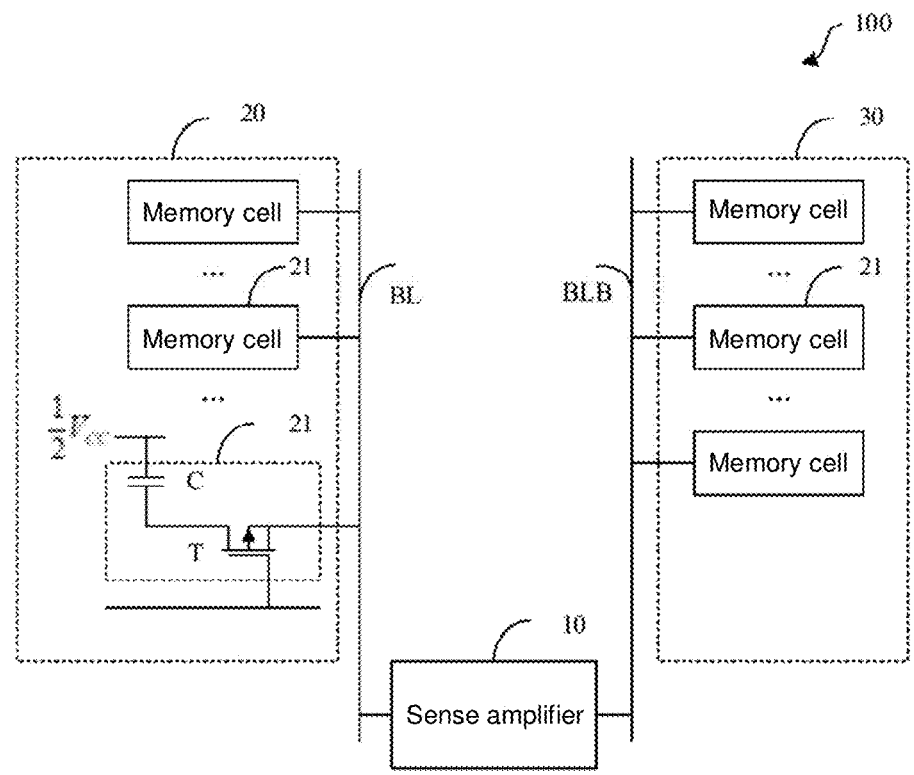
FIG. 1 is a schematic diagram of a circuit structure of a memory according to an embodiment of the present application.

As shown in FIG. 1, an embodiment of the present application provides a memory 100. The memory 100 includes a sense amplifier 10 and a plurality of memory cells 21. A plurality of memory cells 21 constitute a first storage array 20, and a plurality of memory cells 21 constitute a second storage array 30. Each memory cell 21 in the first storage array 20 is connected to a bit line BL of the first storage array 20, and each memory cell 21 in the second storage array 30 is connected to a bit line BL of the second storage array 30.

The sense amplifier 10 is located between the first storage array 20 and the second storage array 30, a first terminal of the sense amplifier 10 is connected to a first power supply terminal, a second terminal of the sense amplifier 10 is connected to a second power supply terminal, a third terminal of the sense amplifier 10 is connected to the bit line of the first storage array 20, and a fourth terminal of the sense amplifier 10 is connected to the bit line of the second storage array 30.

Each memory cell 21 is configured to store one-bit data, the bit line of the first storage array is configured to access data stored in each memory cell 21 in the first storage array 20, and the bit line of the second storage array 30 is configured to access data stored in each memory cell 21 in the second storage array 30. The sense amplifier 10 is configured to amplify the data stored in each memory cell 21, and present the data on the bit line of the first storage array 20 and the bit line of the second storage array 30. The sense amplifier 10 is further configured to: after a data read operation is completed once, restore the memory cell 21 to a state before the read operation.

Each memory cell 21 includes a storage capacitor C and an access transistor T, a first terminal of the storage capacitor C is connected to a fixed power supply, which is, for example, $0.5 V_{CC}$, a second terminal of the storage capacitor C is connected to a first terminal of the access transistor T, a second terminal of the access transistor T is connected to the bit line, and a control terminal of the access transistor T is connected to a word line.

1 and 0 in logic are represented by using a large and a small amount of charge stored in the storage capacitor C, or a high and low voltage difference between two ends of the storage capacitor C. The access transistor T is configured to control whether to allow or forbid to read or rewrite information stored in the storage capacitor C.

For ease of description, when data in a specific memory cell 21 in the first storage array 20 is read, the bit line of the first storage array 20 is referred to as a bit line BL, and the bit line of the second storage array 30 is referred to as a reference bit line BLB. When data in a specific memory cell 21 in the second storage array 30 is read, the bit line of the second storage array 30 is referred to as a bit line BL, and the bit line BL of the first storage array 20 is referred to as a reference bit line BLB.

As a line width of the memory shrinks, a capacitance of a memory cell in the memory decreases, and a noise of a circuit in the memory seriously affects sensing resolution of the sense amplifier. Therefore, an offset cancellation sense amplifier is used in the semiconductor memory.

In the offset cancellation sense amplifier, an amplification module includes two N-type transistors and two P-type transistors. The two P-type transistors remain cross-coupled at all times. At an idle stage and an offset cancellation stage, the two N-type transistors are connected by a diode. At another work stage, the two N-type transistors are connected in another manner.

A process of reading data "1" from one memory cell 21 in the first storage array 20 is described below. Reading data includes the idle stage, the offset cancellation stage, a precharge stage, an access stage, an amplification stage, and a restore stage.

At the idle stage, a single cross-coupled circuit is formed inside the amplification module. In other words, the two P-type transistors constitute a cross-coupled inverter, both the two N-type transistors are connected by a diode, and a charge power supply charges the bit line BL and the reference bit line BLB.

At the offset cancellation stage, a single cross-coupled circuit continues to be formed in the amplification module. Because there is a manufacturing difference between the two transistors connected by a diode, a compensation voltage occurs on the bit line BL and the reference bit line BLB. The compensation voltage may be used to cancel the transistor manufacturing difference in the diode-connected transistor pair (which may be referred to as an offset voltage).

At the precharge stage, a single cross-coupled circuit is constituted in the amplification module. In other words, two transistors constitute a cross-coupled inverter, and control terminals of the other two transistors are left hanging, such that the power supply pulls a voltage at a connection point between the N-type transistor and the P-type transistor, and the compensation voltage is reserved at the connection point.

At the access stage, a double cross-coupled circuit is constituted in the amplification module. In other words, the two P-type transistors constitute a cross-coupled inverter, and the two N-type transistors also constitute a cross-coupled inverter, such that a connection point between the N-type transistor and the P-type transistor pulls voltages of the bit line and the reference bit line to a reference voltage, and the compensation voltage is reserved on the bit line BL and the reference bit line BLB. A signal on a word line corresponding to the accessed memory cell 21 is controlled, such that an access transistor T in the accessed memory cell 21 is on, the storage capacitor C enables the voltage of the bit line BL to rise, and the voltage of the bit line BL is higher than the reference voltage.

At the amplification stage, the voltage of the bit line BL is higher than the reference voltage, such that the sense amplifier 10 pulls up the voltage of the bit line BL, and the sense amplifier pulls down the voltage of the reference bit line BLB. Because the compensation voltage is reserved on the bit line BL and the reference bit line BLB, the transistor manufacturing difference in the transistor pair can be canceled at the amplification stage, such that a voltage difference between the bit line BL and the reference bit line BLB can reflect that data in the accessed memory cell 21 is "1".

At the restore stage, the sense amplifier 10 stabilizes the voltages of the bit line BL and the reference bit line BLB at logical data "1", the bit line BL further charges the storage capacitor C, and after a specific time of charging, charge in the storage capacitor C is restored to a state before the read operation. Then, a signal inside a line is selected by a control column, such that an external read circuit can read the data stored in the accessed memory cell 21 on the bit line BL and the reference bit line BLB.

However, after the offset cancellation stage, the precharge stage, and the amplification stage, the external read circuit is prone to incorrectly reading data presented on the bit line BL and the reference bit line BLB.

To resolve the foregoing problem, the present application provides a sense amplifier, a memory, and a control method. A technical concept of the present application is that when being at an offset cancellation stage, the sense amplifier controls a controlled power module to supply power to an amplification module, and the amplification module controls a value of a compensation voltage on a bit line BL and a reference bit line BLB at an offset cancellation stage, to enable the compensation voltage to be within a rated voltage range, so as to ensure that an external read circuit can accurately read data on the bit line BL and the reference bit line BLB at a restore stage.

Figure 2:
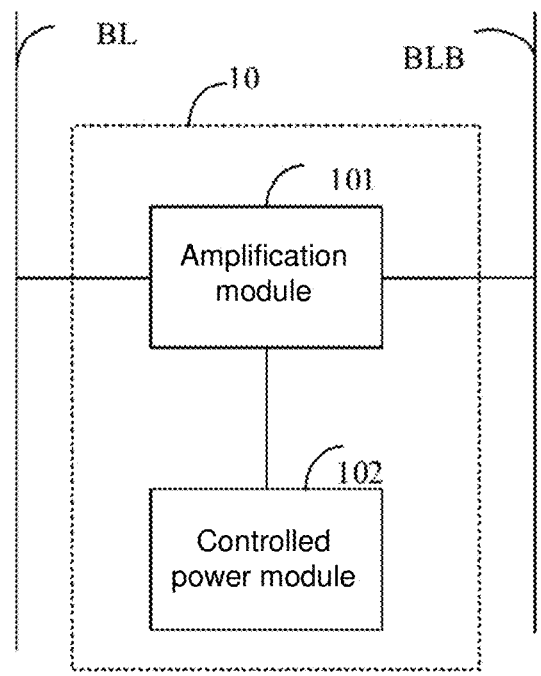
FIG. 2 is a schematic diagram of a circuit structure of a sense amplifier according to another embodiment of the present application.

As shown in FIG. 2, an embodiment of the present application provides a sense amplifier 10, the sense amplifier 10 includes an amplification module 101 and a controlled power module 102, and the amplification module 101 is connected to the controlled power module 102.

The amplification module 101 is configured to amplify a voltage difference between a bit line BL and a reference bit line BLB when the sense amplifier 10 is at an amplification stage. The controlled power module 102 is configured to determine a drive parameter according to a rated compensation voltage range between the bit line BL and the reference bit line BLB, and supply power to the amplification module 101 according to the drive parameter.

Under control of the controlled power module 102, the amplification module 101 pulls a compensation voltage (which may also be referred to as an offset voltage) between the bit line BL and the reference bit line BLB to be a rated compensation voltage at an offset cancellation stage. The rated compensation voltage is within the rated compensation voltage range. The compensation voltage refers to a voltage difference between a voltage of the bit line and a voltage of the reference bit line at the offset cancellation stage. For example, the voltage on the bit line BL minus the voltage on the reference bit line BLB equals the compensation voltage, or the voltage on the reference bit line BLB minus the voltage on the bit line BL equals the compensation voltage.

In a process of reading data in a memory cell, a value of the compensation voltage on the bit line BL and the reference bit line BLB affects data read accuracy. If the compensation voltage on the bit line BL and the reference bit line BLB is excessively large, the compensation voltage is used as an interference factor. Consequently, logical data in the memory cell cannot be accurately presented on the bit line BL and the reference bit line BLB. If the compensation voltage is excessively small, an offset caused by an element manufacturing difference cannot be compensated, and the element manufacturing difference still causes a voltage offset on the bit line BL and the reference bit line BLB. Consequently, logical data in the memory cell cannot be accurately presented on the bit line BL and the reference bit line BLB.

Figure 3A:
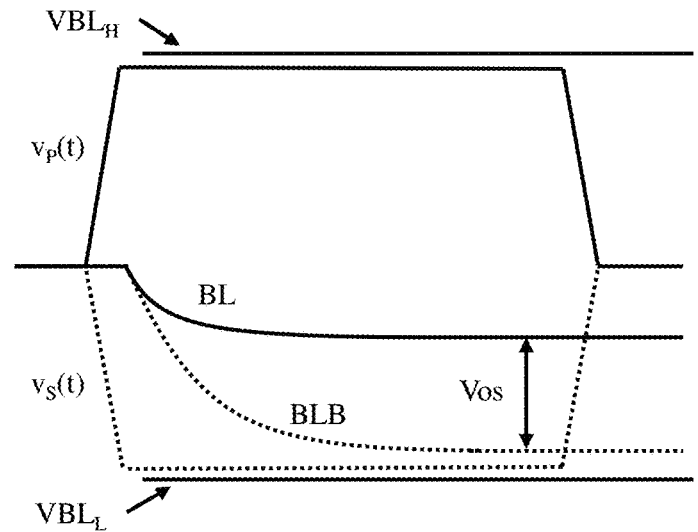
FIG. 3a, FIG. 3b, and FIG. 3c are each a schematic diagram of comparison between pull amplitudes of a voltage of a bit line and a voltage of a reference bit line according to the present application.
Figure 3B:
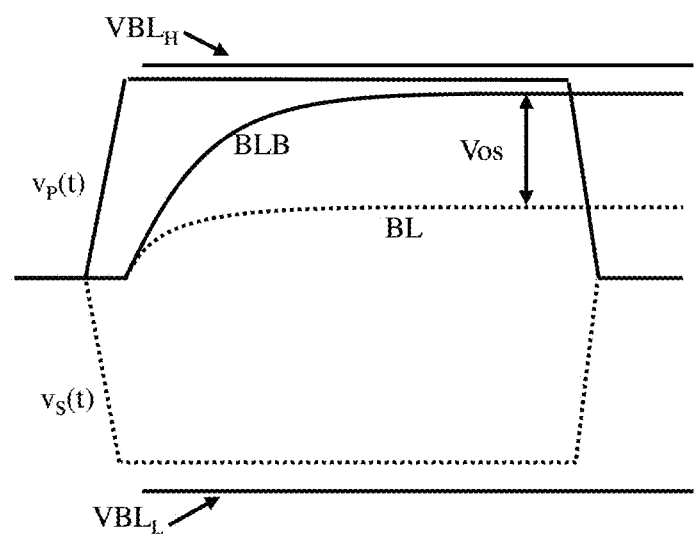

A driving capability of the controlled power module 102 affects a value of the compensation voltage on the bit line BL and the reference bit line BLB at the offset cancellation stage. As shown in FIG. 3a and FIG. 3b, if a first terminal $v_p(t)$ and a second terminal $v_n(t)$ of the sense amplifier has an excessively strong voltage pulling capability, a value of the compensation voltage Vos on the bit line BL and the reference bit line BLB may be excessively large. Consequently, an external read circuit always reads logical data "1" or logical "0" when reading data on the bit line BL and the reference bit line BLB.

Figure 3C:
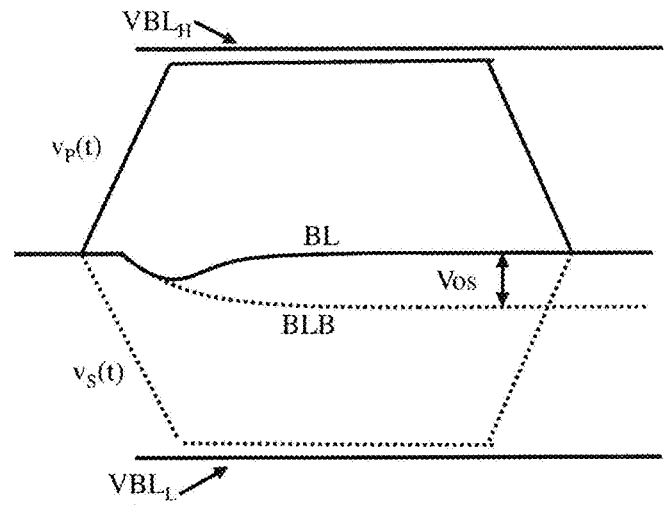

As shown in FIG. 3c, in this embodiment, at a sense amplifier design stage, the rated compensation voltage range may be obtained by simulation, and at a sense amplifier manufacturing stage, the rated compensation voltage range may be obtained by a test. The drive parameter is determined according to the rated compensation voltage range between the bit line BL and the reference bit line BLB, and power is supplied to the amplification module 101 according to the drive parameter. Under control of the controlled power module 102, the amplification module 101 pulls the compensation voltage Vos between the bit line BL and the reference bit line BLB to the rated compensation voltage at the offset cancellation stage.

The rated compensation voltage is within the rated compensation voltage range. After a precharge stage, an access stage, and the amplification stage, the voltage offset that is on the bit line BL and the reference bit line BLB and that is caused by the element manufacturing difference is canceled or partially offset by the rated compensation voltage, and the compensation voltage is not introduced as an interference factor, such that logical data in the memory cell can be accurately presented on the bit line BL and the reference bit line BLB.

In the foregoing technical solution, the controlled power module determines the drive parameter according to the rated compensation voltage range, and supplies power to the amplification module according to the drive parameter, to control the amplification module to pull the compensation voltage between the bit line BL and the reference bit line BLB to the rated compensation voltage at the offset cancellation stage. Therefore, the voltage offset that is on the bit line BL and the reference bit line BLB and that is caused by the element manufacturing difference is canceled or partially offset by the rated compensation voltage, and the compensation voltage is not introduced as an interference factor, such that logical data in the memory cell can be accurately presented on the bit line BL and the reference bit line BLB, and the external read circuit can accurately read the data on the bit line BL and the reference bit line BLB.

Figure 4:
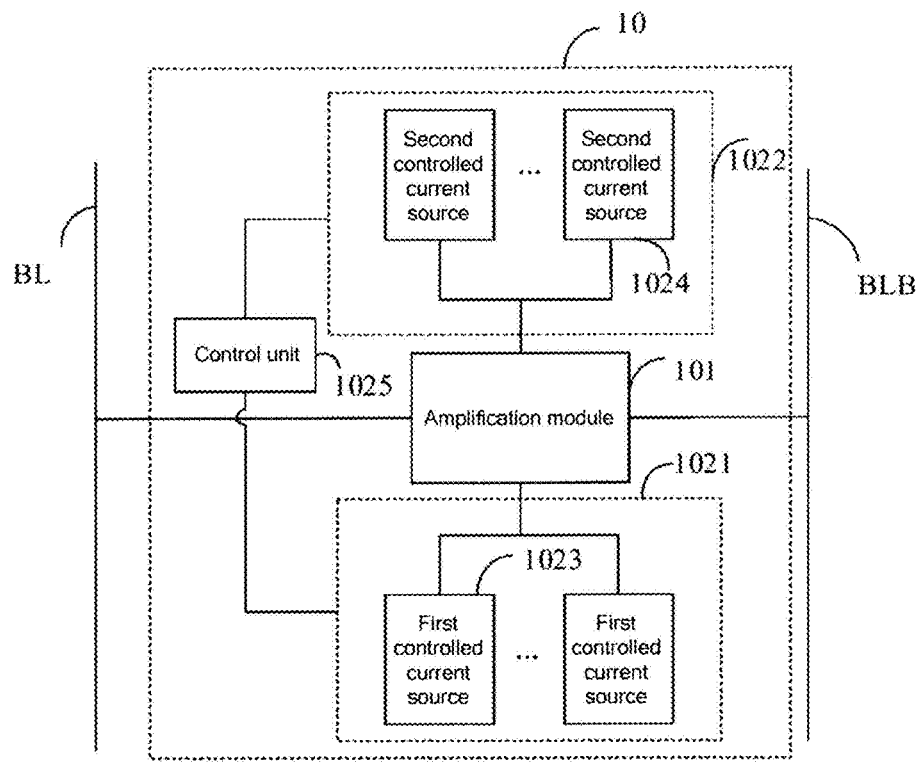
FIG. 4 is a schematic diagram of a circuit structure of a sense amplifier according to another embodiment of the present application.

As shown in FIG. 4, an embodiment of the present application provides a sense amplifier 10, the sense amplifier 10 includes an amplification module 101 and a controlled power module 102, and the amplification module 101 is connected to the controlled power module 102.

The controlled power module 102 includes a first controlled power unit 1021, a second controlled power unit 1022, and a control unit 1025. The amplification module 101 is provided with a first terminal, a second terminal, a third terminal, and a fourth terminal.

An output terminal of the first controlled power unit 1021 is connected to the first terminal of the amplification module 101, an output terminal of the second controlled power unit 1022 is connected to the second terminal of the amplification module 101, the control unit 1025 is connected to a control terminal of the first controlled power unit 1021, and the control unit 1025 is further connected to a control terminal of the second controlled power unit 1022.

Both the first controlled power unit 1021 and the second controlled power unit 1022 are configured to supply power to the amplification module 101, and the control unit 1025 is configured to: determine a drive parameter according to a rated compensation voltage range between a bit line BL and a reference bit line BLB, and control, according to the drive parameter, a first controlled current source 1023 and a second controlled current source 1024 to supply power to the amplification module 101.

Under control of the first controlled power unit 1021 and the second controlled power unit 1022, the amplification module pulls a compensation voltage between the bit line BL and the reference bit line BLB to a rated compensation voltage at an offset cancellation stage. The rated compensation voltage is within the rated compensation voltage range.

The drive parameter is determined according to the rated compensation voltage range between the bit line BL and the reference bit line BLB, and power is supplied to the amplification module according to the drive parameter. Under control of the controlled power module, the amplification module pulls the compensation voltage between the bit line BL and the reference bit line BLB to the rated compensation voltage at the offset cancellation stage.

The rated compensation voltage is within the rated compensation voltage range. After the offset cancellation stage, a precharge stage, an access stage, and an amplification stage, a voltage offset that is on the bit line BL and the reference bit line BLB and that is caused by an element manufacturing difference is canceled or partially offset by the rated compensation voltage, and the compensation voltage is not introduced as an interference factor, such that logical data in a memory cell can be accurately presented on the bit line BL and the reference bit line BLB.

In another embodiment, the first controlled power unit 1021 includes N first controlled current sources 1023. Each first controlled current source 1023 is provided with a control terminal, a first terminal, and a second terminal. The second terminal of each first controlled current source 1023 is the output terminal of the first controlled power unit 1021, and the control terminal of each first controlled current source 1023 is the control terminal of the first controlled power unit 1021. The first terminal of the first controlled current source 1023 is connected to a first power supply terminal, and the second terminal of the first controlled current source 1023 is connected to the first terminal of the amplification module 101. The control terminal of the first controlled current source 1023 is connected to the control unit 1025, where N is a positive integer.

The second controlled power unit 1022 includes N second controlled current sources 1024, and each second controlled current source 1024 is provided with a control terminal, a first terminal, and a second terminal. The second terminal of each second controlled current source 1024 is the output terminal of the second controlled power unit 1022, and the control terminal of each second controlled current source 1024 is the control terminal of the second controlled power unit 1022. The first terminal of the second controlled current source 1024 is connected to a second power supply terminal, and the second terminal of the second controlled current source 1024 is connected to the second terminal of the amplification module 101. The control terminal of the second controlled current source 1024 is connected to the control unit 1025.

The control unit is configured to: determine a first drive current range and a second drive current range according to the rated compensation voltage range, select at least one first target current source in the N first controlled current sources, and select at least one second target current source in the N second controlled current sources. A total current provided by the at least one first target current source is within the first drive current range, and a total current provided by the at least one second target current source is within the second drive current range. The control unit further generates a first control signal used to control the first target current source to work, and generates a second control signal used to control the second target current source to work, to enable the first controlled power unit to control the amplification module to pull voltages of the bit line BL and the reference bit line BLB at the offset cancellation stage, and enable the second controlled power unit to control the amplification module to pull voltages of the bit line BL and the reference bit line BLB at the offset cancellation stage, to further pull the compensation voltage between the bit line BL and the reference bit line BLB to be the rated compensation voltage at the offset cancellation stage.

In another embodiment, an $i^{th}$ first controlled current source 1023 provides a drive current $2^{i-1} \times I_b$, a $j^{th}$ second controlled current source 1024 provides a drive current $2^{j-1} \times I_b$, and $I_b$ represents a unit current. The N first controlled current sources 1023 may provide $2^N-1$ levels of drive current, and the N second controlled current sources 1024 may also provide $2^N-1$ levels of drive current. Rates at which the amplification module 101 pulls the voltage of the bit line and the voltage of the reference bit line can be accurately adjusted by adjusting an amplitude value of the unit current, to further control amplitude values for pulling the voltage of the bit line and the voltage of the reference bit line, so as to accurately control the compensation voltage between the bit line BL and the reference bit line BLB to be within the rated compensation voltage range at the offset cancellation stage.

In the foregoing embodiment, work states of the first controlled current source and the second controlled current source are controlled, to control a drive parameter of the first controlled power unit and the second controlled power unit, and control rates at which the amplification module pulls the voltages of the bit line BL and the reference bit line, to further control amplitudes for pulling the voltage of the bit line and the voltage of the reference bit line, and control the amplification module to pull the compensation voltage between the bit line BL and the reference bit line BLB to be the rated compensation voltage at the offset cancellation stage. In this case, the voltage offset that is on the bit line BL and the reference bit line BLB and that is caused by the element manufacturing difference is canceled or partially offset by the rated compensation voltage, and the compensation voltage is not introduced as an interference factor, such that logical data in the memory cell can be accurately presented on the bit line BL and the reference bit line BLB, and the external read circuit can accurately read the data on the bit line BL and the reference bit line BLB.

Figure 5:
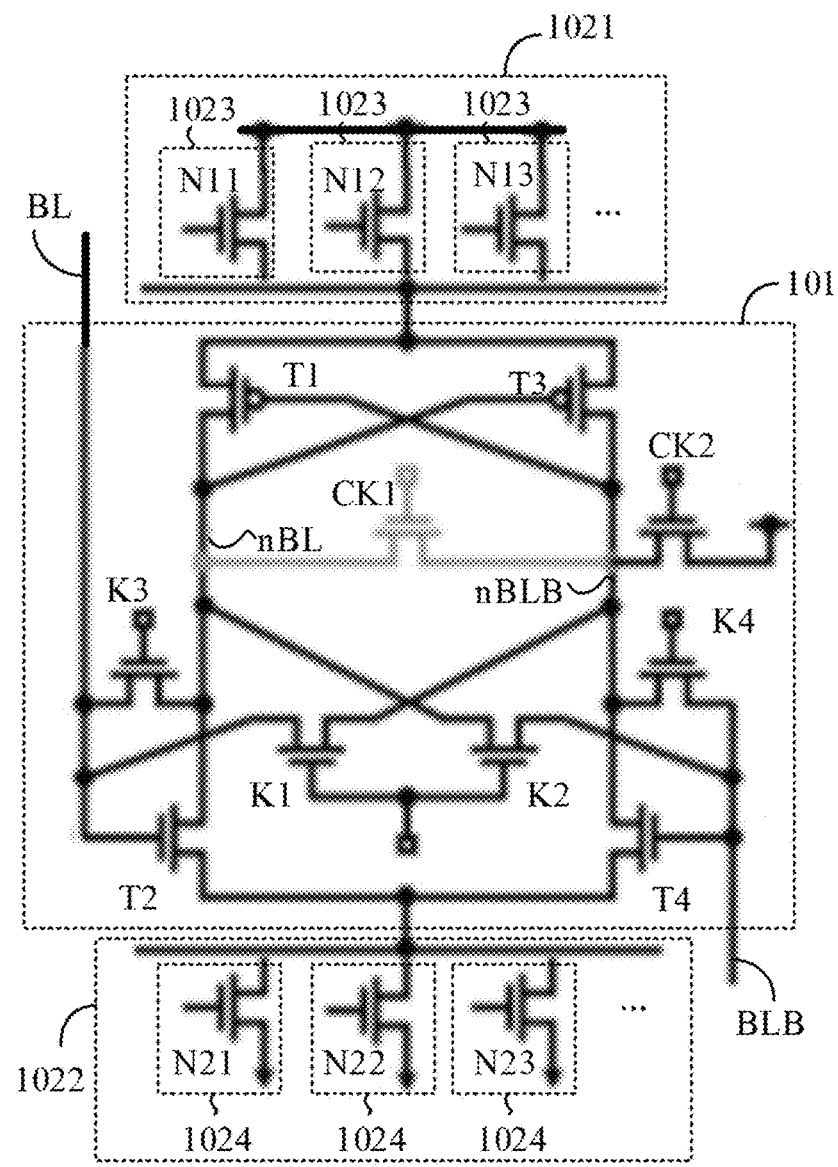
FIG. 5 is a schematic diagram of a circuit structure of a sense amplifier according to another embodiment of the present application.

As shown in FIG. 5, an embodiment of the present application provides a sense amplifier 10, the sense amplifier 10 includes an amplification module 101 and a controlled power module 102, and the amplification module 101 is connected to the controlled power module 102.

The amplification module 101 includes at least one cross-coupled amplifier circuit, each cross-coupled amplifier circuit is provided with a first terminal, a second terminal, a third terminal, and a fourth terminal, the first terminal of the cross-coupled amplifier circuit is connected to an output terminal of a first controlled power unit 1021, the second terminal of the cross-coupled amplifier circuit is connected to an output terminal of the second controlled power unit 1022, the third terminal of the cross-coupled amplifier circuit is connected to a bit line BL, and the fourth terminal of the cross-coupled amplifier circuit is connected to a reference bit line BLB.

The cross-coupled amplifier circuit is a single cross-coupled amplifier circuit and has an offset cancellation function, and the cross-coupled circuit specifically includes: a first transistor T1, a second transistor T2, a third transistor T3, a fourth transistor T4, a first switch K1, a second switch K2, a third switch K3, and a fourth switch K4.

A first terminal of the first transistor T1 is the first terminal of the cross-coupled amplifier circuit, a second terminal of the second transistor T2 is the second terminal of the cross-coupled amplifier circuit, a second terminal of the first transistor T1 is the third terminal of the cross-coupled amplifier circuit, and a second terminal of the third transistor T3 is the fourth terminal of the cross-coupled amplifier circuit.

The second terminal of the first transistor T1 is connected to a first terminal of the second transistor T2, the second terminal of the third transistor T3 is connected to a first terminal of the fourth transistor T4, the first terminal of the first transistor T1 is connected to a first terminal of the third transistor T3, and the second terminal of the second transistor T2 is connected to a second terminal of the fourth transistor T4.

A control terminal of the first transistor T1 is connected to the second terminal of the third transistor T3, a control terminal of the second transistor T2 is connected to the second terminal of the third transistor T3 by the first switch K1, and the control terminal of the second transistor T2 is connected to the first terminal of the second transistor T2 by the third switch K3.

A control terminal of the third transistor T3 is connected to the second terminal of the first transistor T1, a control terminal of the fourth transistor T4 is connected to the second terminal of the first transistor T1 by the second switch K2, and the control terminal of the fourth transistor T4 is connected to the first terminal of the fourth transistor T4 by the fourth switch K4.

The first transistor T1 and the third transistor T3 are P-type transistors, and the second transistor T2 and the fourth transistor T4 are N-type transistors.

The controlled power module 102 includes the first controlled power unit 1021 and the second controlled power unit 1022, the first controlled power unit 1021 includes N first controlled current sources 1023, and the second controlled power unit 1022 includes N second controlled current sources 1024. The first controlled current source 1023 is a P-type transistor, and the second controlled current source 1024 is an N-type transistor.

A process of reading data "1" from one memory cell 21 in the first storage array 20 is described below. For ease of description, a connection line between the second terminal of the first transistor T1 and the first terminal of the second transistor T2 is referred to as an internal bit line nBL of a first storage array 20, and a connection line between the second terminal of the third transistor T3 and the first terminal of the fourth transistor T4 is referred to as an internal reference bit line nBLB of the first storage array 20.

Figure 6:
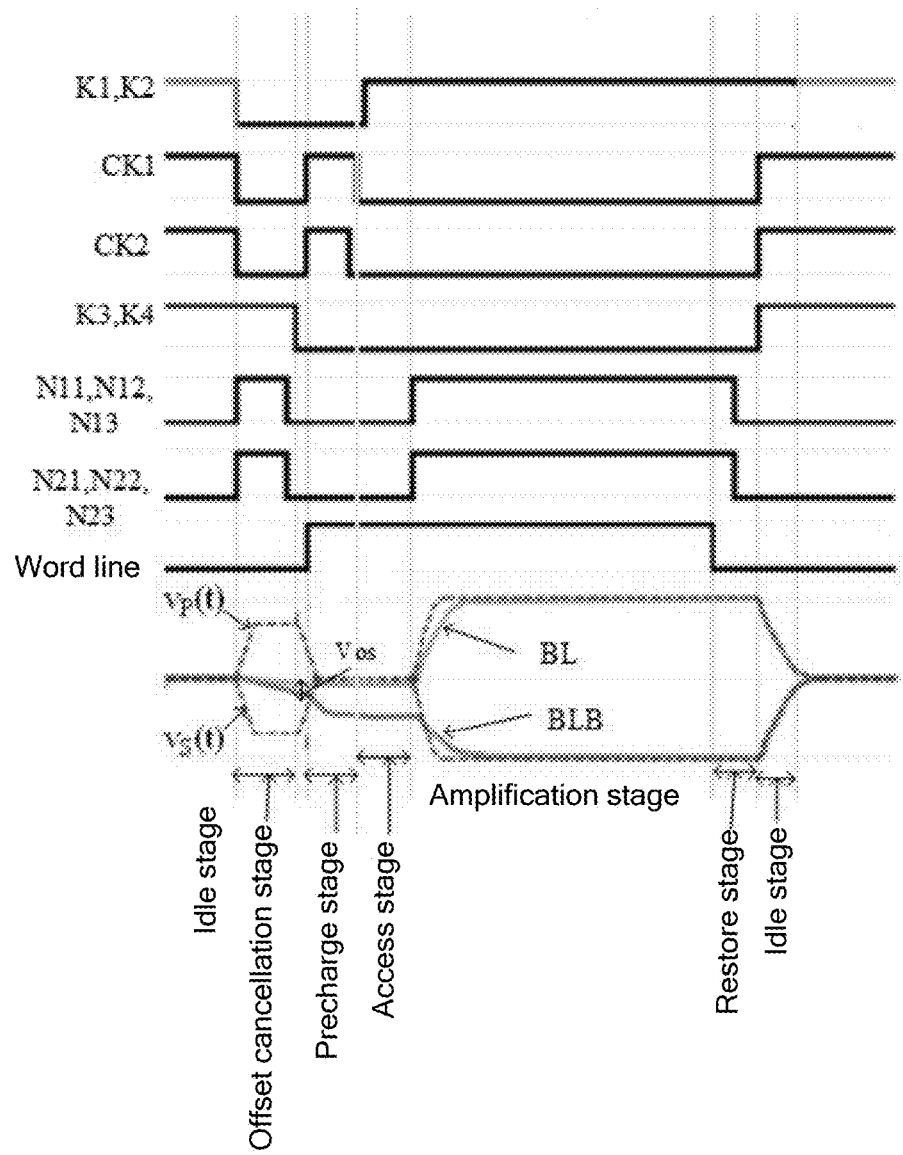
FIG. 6 is a time sequence diagram of data read according to another embodiment of the present application.

As shown in FIG. 6, reading data includes an idle stage, an offset cancellation stage, a precharge stage, an access stage, an amplification stage, and a restore stage.

At the idle stage, the first switch K1 to the fourth switch K4 are closed. The control terminal of the second transistor T2 is connected to the second terminal of the third transistor T3, the control terminal of the second transistor T2 is connected to the first terminal of the second transistor T2, the control terminal of the fourth transistor T4 is connected to the second terminal of the first transistor T1, and the control terminal of the fourth transistor T4 is connected to the first terminal of the fourth transistor T4. The charge switches CK1 and CK2 are closed, and the internal bit line nBL and the internal reference bit line nBLB are charged by a charge power supply. In this case, in an embodiment, the bit line BL, the reference bit line BLB, the internal bit line nBL, and the internal reference bit line nBLB are all charged to 0.5 $V_{CC}$.

Figure 7:
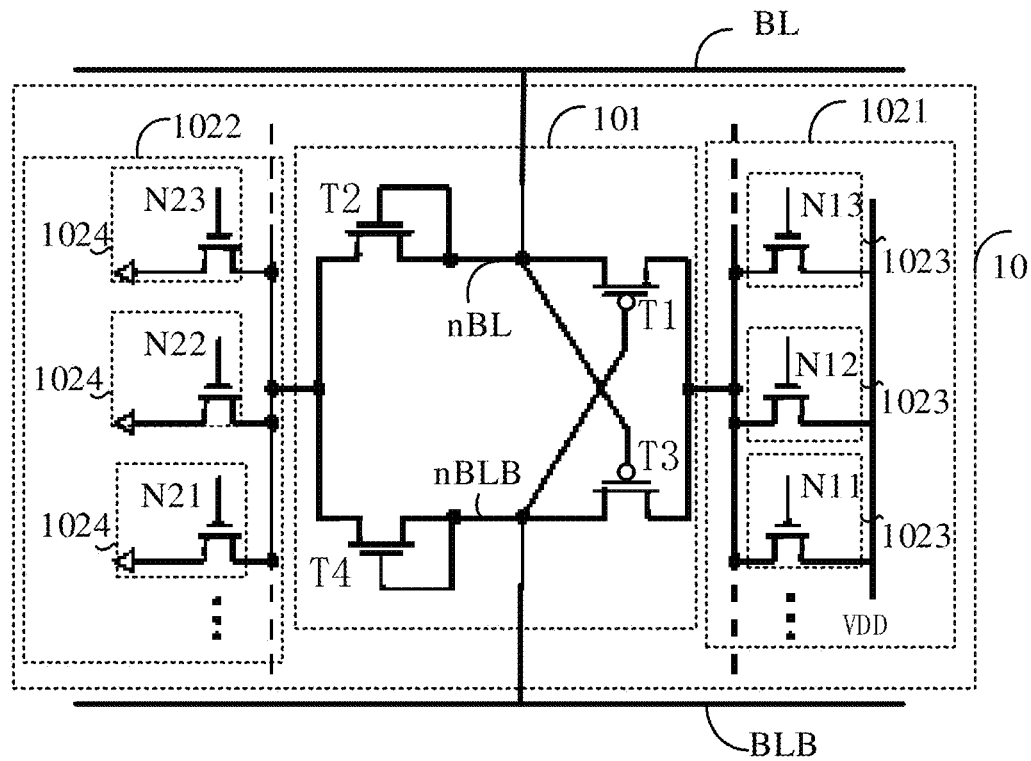
FIG. 7 is an equivalent circuit diagram of a sense amplifier at an offset cancellation stage according to another embodiment of the present application.

At the offset cancellation stage, the first switch K1 and the second switch K2 are disconnected, and the third switch K3 and the fourth switch K4 are still closed. As shown in FIG. 7, the first terminal of the second transistor T2 is connected to the control terminal of the second transistor T2, the first terminal of the fourth transistor T4 is connected to the control terminal of the fourth transistor T4, both the two N-type transistors are connected by a diode, and the two P-type transistors constitute a cross-coupled inverter. Because there is a manufacturing difference between the two transistors connected by a diode, a compensation voltage occurs on the bit line BL and the reference bit line BLB. The compensation voltage may be used to cancel the transistor manufacturing difference in the N-type transistor pair. At least one N-type transistor of N11, N12, N13 is controlled according to a waveform in the figure, and at least one N-type transistor of N21, N22, N23 is controlled according to a waveform in the figure, to control a drive parameter of the first controlled power unit 1021 and the second controlled power unit 1022, so as to control amplitude values for pulling voltages of the bit line BL and the reference bit line by the cross-coupled amplifier circuit at the offset cancellation stage, such that the compensation voltage between the bit line BL and the reference bit line BLB is pulled to be the rated compensation voltage.

At the precharge stage, the first switch K1 to the fourth switch K4 are all disconnected. In other words, the two N-type transistors constitute a cross-coupled inverter, and control terminals of the other two transistors are left hanging. Both a voltage of the internal bit line nBL of the first storage array 20 and a voltage of the internal reference bit line nBLB are pulled up to a reference voltage, and the reference voltage is a voltage of a fixed power supply connected to the storage capacitor C. In an embodiment, the voltage of the fixed power supply is 0.5 $V_{CC}$.

At the access stage, the first switch K1 and the second switch K2 are closed, and the third switch K3 and the fourth switch K4 continue to be disconnected. A double cross-coupled circuit is constituted in the amplification module. In other words, two transistors constitute a cross-coupled inverter, and the other two transistors also constitute a cross-coupled inverter. The internal bit line nBL pulls the voltage of the bit line, the internal reference bit line nBLB pulls the voltage of the reference bit line, and the compensation voltage is still reserved on the bit line BL and the reference bit line BLB. For example, at the offset cancellation stage, the voltage on the bit line BL is higher than the voltage of the reference bit line BLB, and a difference is a compensation voltage Vos. At the access stage, the voltage on the bit line BL is still higher than the voltage of the reference bit line BLB, and a difference is also the compensation voltage Vos. If an offset between threshold voltages of T2 and T4 is Vos, an offset between threshold voltages of T1 and T3 is Vos, or an offset between threshold voltages that occur on T2 and T1 together with T4 and T3 is Vos, at the access stage, impact of Vos on the sense amplifier is eliminated or at least weakened.

A signal on a word line corresponding to the accessed memory cell 21 is controlled, such that an access transistor T in the accessed memory cell 21 is on, the storage capacitor C enables the voltage of the bit line BL to rise, and the voltage of the bit line is higher than the reference voltage.

At the amplification stage, the first switch K1 and the second switch K2 continue to be closed, and the third switch K3 and the fourth switch K4 continue to be disconnected. At least one P-type transistor of N11, N12, N13 is controlled according to a waveform in the figure, and at least one N-type transistor of N21, N22, N23 is controlled according to a waveform in the figure, to control a drive parameter of the first controlled power unit 1021 and the second controlled power unit 1022, so as to control amplitude values for pulling voltages of the bit line BL and the reference bit line by the cross-coupled amplifier circuit at the amplification stage. The voltage of the bit line BL is higher than the reference voltage, such that the sense amplifier 10 pulls up the voltage of the bit line BL, and the sense amplifier pulls down the voltage of the reference bit line BLB. Because the compensation voltage is reserved on the bit line BL and the reference bit line BLB, the manufacturing difference between the N-type transistors in the sense amplifier can be offset or canceled at the amplification stage, such that a voltage difference between the bit line BL and the reference bit line BLB can reflect that data in the accessed memory cell 21 is "1".

At the restore stage, the sense amplifier 10 stabilizes the voltages of the bit line BL and the reference bit line BLB at logical data "1", the bit line BL further charges the storage capacitor C, and after a specific time of charging, charge in the storage capacitor C is restored to a state before the read operation. Then, a signal inside a line is selected by a control column, such that an external read circuit can read the data stored in the accessed memory cell 21 on the bit line BL and the reference bit line BLB.

In another embodiment, an $i^{th}$ P-type transistor in the first controlled power unit 1021 may provide a drive current $2^{i-1} \times I_b$, a $j^{th}$ N-type transistor in the second controlled power unit 1022 may provide a drive current $2^{j-1} \times I_b$, and $I_b$ represents a unit current. The first controlled power unit 1021 may provide $2^N-1$ levels of drive current, and the second controlled power unit 1022 may also provide $2^N-1$ levels of drive current, such that $(2^N-1)(2^N-1)$ levels of compensation voltage can be obtained.

A level of a drive current that may be provided by the controlled power module 102 is described by using an example below. The first controlled power unit 1021 includes three P-type transistors. A drive current that may be provided by the $1^{st}$ P-type transistor is $I_b$, a drive current that may be provided by the $2^{nd}$ P-type transistor is $2I_b$, and a drive current that may be provided by the $3^{rd}$ P-type transistor is $4I_b$. The second controlled power unit 1022 includes three N-type transistors. A drive current that may be provided by the $1^{st}$ N-type transistor is $I_b$, a drive current that may be provided by the $2^{nd}$ N-type transistor is $2I_b$, and a drive current that may be provided by the $3^{rd}$ N-type transistor is $4I_b$.

The controlled power module 102 may provide 7 levels of drive current. Control signals of N-type transistors and P-type transistors at each level are shown in Table 1 and Table 2. "1" represents a high level control signal and "0" represents a low level control signal.

TABLE 1

| Control signal of an N-type transistor | | | |
|---|---|---|---|
| $3^{rd}$ N-type transistor | $2^{nd}$ N-type transistor | $1^{st}$ N-type transistor | Level of a drive current |
| 0 | 0 | 1 | $I_b$ |
| 0 | 1 | 0 | $2I_b$ |
| 0 | 1 | 1 | $3I_b$ |
| 1 | 0 | 0 | $4I_b$ |
| 1 | 0 | 1 | $5I_b$ |
| 1 | 1 | 0 | $6I_b$ |
| 1 | 1 | 1 | $7I_b$ |

TABLE 2

| Control signal of a P-type transistor | | | |
|---|---|---|---|
| $3^{rd}$ P-type transistor | $2^{nd}$ P-type transistor | $1^{st}$ P-type transistor | Level of a drive current |
| 1 | 1 | 0 | $I_b$ |
| 1 | 0 | 1 | $2I_b$ |
| 1 | 0 | 0 | $3I_b$ |
| 0 | 1 | 1 | $4I_b$ |
| 0 | 1 | 0 | $5I_b$ |
| 0 | 0 | 1 | $6I_b$ |
| 0 | 0 | 0 | $7I_b$ |

In the technical solution, an on state of the P-type transistor and an on state of the N-type transistor are controlled, to control the controlled power module to provide the level of the drive current to the amplification module, so as to control amplitude values for pulling the voltage of the bit line and the voltage of the reference bit line by the amplification module at the offset cancellation stage, and the amplification module may be controlled to pull the compensation voltage between the bit line BL and the reference bit line BLB to be the rated compensation voltage at the offset cancellation stage. Therefore, the voltage offset that is on the bit line BL and the reference bit line BLB and that is caused by the element manufacturing difference is canceled or partially offset by the rated compensation voltage, and the compensation voltage is not introduced as an interference factor, such that logical data in the memory cell can be accurately presented on the bit line BL and the reference bit line BLB, and the external read circuit can accurately read the data on the bit line BL and the reference bit line BLB.

Figure 8:
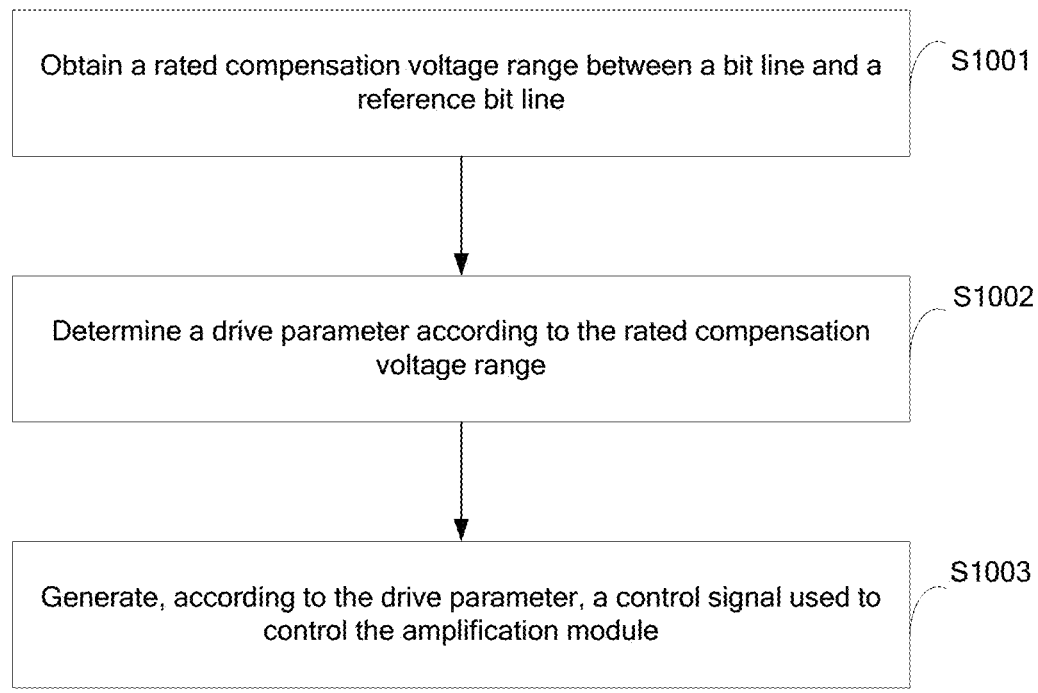
FIG. 8 is a schematic diagram of a procedure of a control method of a sense amplifier according to another embodiment of the present application.

As shown in FIG. 8, an embodiment of the present application provides a control method of a sense amplifier. A structure of the sense amplifier has been described in detail in the foregoing embodiment, and details are not described herein again. The control method specifically includes the following steps.

S1001. Obtain a rated compensation voltage range between a bit line and a reference bit line.

At a sense amplifier design stage, the rated compensation voltage range may be obtained by simulation, and at a sense amplifier manufacturing stage, the rated compensation voltage range may be obtained by a test. When a compensation voltage between a bit line and a reference bit line is within the rated compensation voltage range, data on the bit line and the reference bit line can be accurately read. In other words, a voltage offset that is on the bit line and the reference bit line and that is caused by an element manufacturing difference is canceled or partially offset by the rated compensation voltage, and the compensation voltage is not introduced as an interference factor, such that logical data in a memory cell can be accurately presented on the bit line and the reference bit line, and an external read circuit can accurately read the data on the bit line and the reference bit line.

S1002. Determine a drive parameter according to the rated compensation voltage range.

The sense amplifier is tested, to obtain a mapping relationship between the compensation voltage between the bit line and the reference bit line and a drive parameter of a controlled power module, and then determine the drive parameter of the controlled power module according to the mapping relationship and the rated compensation voltage range.

S1003. Generate, according to the drive parameter, a control signal used to control the amplification module.

After the drive parameter of the controlled power module is obtained, the control signal is generated according to the drive parameter, to control the controlled power module to supply power to the amplification module according to the drive parameter, and further control the amplification module to pull the compensation voltage between the bit line or the reference bit line to the rated compensation voltage at the offset cancellation stage. The rated compensation voltage is within the rated compensation voltage range.

In the foregoing technical solution, the controlled power module determines the drive parameter according to the rated compensation voltage range, and supplies power to the amplification module according to the drive parameter, to control the amplification module to pull the compensation voltage between the bit line and the reference bit line to the rated compensation voltage at the offset cancellation stage. Therefore, the voltage offset that is on the bit line and the reference bit line and that is caused by the element manufacturing difference is canceled or partially offset by the rated compensation voltage, and the compensation voltage is not introduced as an interference factor, such that logical data in the memory cell can be accurately presented on the bit line and the reference bit line, and the external read circuit can accurately read the data on the bit line and the reference bit line.

The present application further provides a control method of a sense amplifier. A structure of the sense amplifier has been described in detail in the foregoing embodiment, and details are not described herein again. The control method specifically includes the following steps.

S2001. Obtain a rated compensation voltage range between a bit line and a reference bit line.

The step has been described in detail in the foregoing embodiment, and details are not described herein again.

S2002. Determine a first drive current range and a second drive current range according to the rated compensation voltage range.

The sense amplifier is tested, to obtain a mapping relationship between a compensation voltage between the bit line and the reference bit line and a drive current of a first controlled power unit and a second controlled power unit, and then determine the first drive current range of the first controlled power module and the second drive current range of the second controlled power module according to the mapping relationship and the rated compensation voltage range.

S2003. Generate, according to the drive parameter, a control signal used to control the amplification module.

After the first drive current range is determined, at least one first target current source is selected in N first controlled current sources, to ensure that a total current provided by the at least one first target current source is within the first drive current range. In addition, after the second drive current range is determined, at least one second target current source is selected in N second controlled current sources, to ensure that a total current provided by the at least one second target current source is within the second drive current range. Then, a first control signal used to control the first target current source to work is generated, and a second control signal used to control the second target current source to work is generated. The first controlled power unit and the second controlled power unit control the amplification module to pull the compensation voltage between the bit line and the reference bit line to be a rated compensation voltage at an offset cancellation stage. The rated compensation voltage is within the rated compensation voltage range.

In the foregoing embodiment, work states of the first controlled current source and the second controlled current source are controlled, to control the controlled power module to provide a level of a drive current to the amplification module, so as to control amplitude values for pulling a voltage of the bit line and a voltage of the reference bit line by the amplification module at the offset cancellation stage, and the amplification module may be controlled to pull the compensation voltage between the bit line and the reference bit line to be the rated compensation voltage at the offset cancellation stage. Therefore, a voltage offset that is on the bit line and the reference bit line and that is caused by an element manufacturing difference is canceled or partially canceled by the rated compensation voltage, and the compensation voltage is not introduced as an interference factor, such that logical data in a memory cell can be accurately presented on the bit line and the reference bit line, and an external read circuit can accurately read the data on the bit line and the reference bit line.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the technical solutions of the embodiments of the present application.

The invention claimed is:

1. A sense amplifier, comprising:
   an amplification circuit, configured to amplify a voltage difference between a bit line and a reference bit line when the sense amplifier is at an amplification stage; and
   a controlled power circuit, connected to the amplification circuit, and configured to determine a drive current range according to a rated compensation voltage range between the bit line and the reference bit line, and supply a drive current to the amplification circuit according to the drive current range, so as to control the amplification circuit to pull a compensation voltage between the bit line and the reference bit line to be a rated compensation voltage at an offset cancellation stage; wherein the rated compensation voltage is within the rated compensation voltage range;
   wherein the controlled power circuit is configured to determine the drive current range according to the rated compensation voltage range in the following manner:
   testing the sense amplifier to obtain a mapping relationship between the compensation voltage between the bit line and the reference bit line and the drive current, and
   determining the drive current range according to the mapping relationship and the rated compensation voltage range.

2. The sense amplifier of claim 1, wherein the controlled power circuit comprises:
   a first controlled power circuit, connected to a first terminal of the amplification circuit, and configured to supply the drive current to the amplification circuit;
   a second controlled power circuit, connected to a second terminal of the amplification circuit, and configured to supply the drive current to the amplification circuit; and
   a controller, connected to the first controlled power circuit, further connected to the second controlled power circuit, and configured to determine the drive current range according to the rated compensation voltage range, and control the first controlled power circuit and the second controlled power circuit to supply the drive current to the amplification circuit according to the drive current range.

3. The sense amplifier of claim 2, wherein the first controlled power circuit comprises:
   N first controlled current sources, wherein each first controlled current source of the N first controlled current sources is provided with a control terminal, a first terminal, and a second terminal; the first terminal of the each first controlled current source is connected to a first power supply terminal, the second terminal of the each first controlled current source is connected to the first terminal of the amplification circuit, the control terminal of the each first controlled current source is connected to the controller, and N is a positive integer.

4. The sense amplifier of claim 3, wherein the second controlled power circuit comprises:
N second controlled current sources, wherein each second controlled current source of the N second controlled current sources is provided with a control terminal, a first terminal, and a second terminal; the first terminal of the each second controlled current source is connected to a second power supply terminal, the second terminal of the each second controlled current source is connected to the second terminal of the amplification circuit, and the control terminal of the each second controlled current source is connected to the controller.

5. The sense amplifier of claim 4, wherein the controller is configured to:
determine a first drive current range and a second drive current range according to the rated compensation voltage range;
select at least one first target current source from the N first controlled current sources, and select at least one second target current source from the N second controlled current sources; wherein a total current provided by the at least one first target current source is within the first drive current range, and a total current provided by the at least one second target current source is within the second drive current range; and
generate a first control signal used to control the at least one first target current source to work, and generate a second control signal used to control the at least one second target current source to work; such that the first controlled power circuit controls the amplification circuit to pull voltages of the bit line and the reference bit line at the offset cancellation stage, and the second controlled power circuit controls the amplification circuit to pull the voltages of the bit line and the reference bit line at the offset cancellation stage.

6. The sense amplifier of claim 3, wherein a drive current of an $i^{th}$ first current source is $2^{i-1} \times I_b$, a drive current of a $j^{th}$ second current source is $2^{j-1} \times I_b$, and $I_b$ represents a unit current.

7. The sense amplifier of claim 4, wherein the each first controlled current source is a P-type transistor, and the each second controlled current source is an N-type transistor.

8. The sense amplifier of claim 2, wherein the amplification circuit comprises:
at least one cross-coupled amplifier circuit, wherein each cross-coupled amplifier circuit of the at least one cross-coupled amplifier circuit is provided with a first terminal, a second terminal, a third terminal, and a fourth terminal; the first terminal of the each cross-coupled amplifier circuit is connected to an output terminal of the first controlled power circuit, the second terminal of the each cross-coupled amplifier circuit is connected to an output terminal of the second controlled power circuit, the third terminal of the each cross-coupled amplifier circuit is connected to the bit line, and the fourth terminal of the each cross-coupled amplifier circuit is connected to the reference bit line.

9. The sense amplifier of claim 8, wherein the each cross-coupled amplifier circuit comprises: a first transistor, a second transistor, a third transistor, a fourth transistor, a first switch, a second switch, a third switch, and a fourth switch;
a first terminal of the first transistor forms the first terminal of the each cross-coupled amplifier circuit, a second terminal of the second transistor forms the second terminal of the each cross-coupled amplifier circuit, a second terminal of the first transistor forms the third terminal of the each cross-coupled amplifier circuit, and a second terminal of the third transistor forms the fourth terminal of the each cross-coupled amplifier circuit;
the second terminal of the first transistor is connected to a first terminal of the second transistor, the second terminal of the third transistor is connected to a first terminal of the fourth transistor, the first terminal of the first transistor is connected to a first terminal of the third transistor, and the second terminal of the second transistor is connected to a second terminal of the fourth transistor;
a control terminal of the first transistor is connected to the second terminal of the third transistor, a control terminal of the second transistor is connected to the second terminal of the third transistor by the first switch, and the control terminal of the second transistor is connected to the first terminal of the second transistor by the third switch; and
a control terminal of the third transistor is connected to the second terminal of the first transistor, a control terminal of the fourth transistor is connected to the second terminal of the first transistor by the second switch, and the control terminal of the fourth transistor is connected to the first terminal of the fourth transistor by the fourth switch.

10. The sense amplifier of claim 9, wherein the first transistor and the third transistor are P-type transistors, and the second transistor and the fourth transistor are N-type transistors.

11. A memory, comprising the sense amplifier of claim 1 and a plurality of memory cells, wherein
a part of the plurality of memory cells constitutes a first storage array, another part of the plurality of memory cells constitutes a second storage array, the sense amplifier is located between the first storage array and the second storage array, a third terminal of the sense amplifier is connected to the bit line of the first storage array, and a fourth terminal of the sense amplifier is connected to the reference bit line of the second storage array.

12. A control method of a sense amplifier, wherein
the sense amplifier comprises an amplification circuit and a controlled power circuit;
obtaining a rated compensation voltage range between a bit line and a reference bit line;
determining a drive current range of the controlled power circuit according to the rated compensation voltage range; and
generating, according to the drive current range, a control signal used to control the amplification circuit, so as to control the amplification circuit to pull a compensation voltage between the bit line and the reference bit line to be a rated compensation voltage at an offset cancellation stage; wherein the rated compensation voltage is within the rated compensation voltage range;
wherein the determining a drive current range of the controlled power circuit according to the rated compensation voltage range comprises:

testing the sense amplifier to obtain a mapping relationship between the compensation voltage between the bit line and the reference bit line and a drive current; and determining the drive current range according to the mapping relationship and the rated compensation voltage range.

13. The method of a sense amplifier of claim 12, wherein the determining a drive current range of the controlled power circuit according to the rated compensation voltage range comprises:

determining a first drive current range and a second drive current range according to the rated compensation voltage range.

14. The method of a sense amplifier of claim 13, wherein the controlled power circuit comprises a first controlled power circuit and a second controlled power circuit; and the generating, according to the drive current range, a control signal used to control the amplification circuit comprises:

selecting at least one first target current source from N first controlled current sources, and selecting at least one second target current source from N second controlled current sources, wherein a total current provided by the at least one first target current source is within the first drive current range, and a total current provided by the at least one second target current source is within the second drive current range; and generating a first control signal used to control the at least one first target current source to work, and generating a second control signal used to control the at least one second target current source to work.

15. The sense amplifier of claim 1, wherein in response to the amplification circuit pulling the compensation voltage between the bit line and the reference bit line to be the rated compensation voltage at the offset cancellation stage, a voltage of the bit line is decreased from an initial voltage of the bit line at a beginning of the offset cancellation stage to reach a minimal value, and then is increased to reach a first value, and a voltage of the reference bit line is successively decreased from an initial voltage of the reference bit line at the beginning of the offset cancellation stage to reach a second value, wherein a difference between the first value and the second value is the rated compensation voltage.

* * * * *